United States Patent
Lung et al.

(10) Patent No.: US 8,138,028 B2
(45) Date of Patent: Mar. 20, 2012

(54) METHOD FOR MANUFACTURING A PHASE CHANGE MEMORY DEVICE WITH PILLAR BOTTOM ELECTRODE

(75) Inventors: Hsiang Lan Lung, Hsinchu (TW); Chieh Fang Chen, Banciao (TW); Yi Chou Chen, Hsinchu (TW); Shih Hung Chen, Jhudong Township (TW); Chung Hon Lam, Peekskill, NY (US); Eric Andrew Joseph, White Plains, NY (US); Alejandro Gabriel Schrott, New York, NY (US); Matthew J. Breitwisch, Yorktown Heights, NY (US); Geoffrey William Burr, Cupertino, CA (US); Thomas D. Happ, Tarrytown, NY (US); Jan Boris Philipp, Peekskill, NY (US)

(73) Assignees: Macronix International Co., Ltd, Hsinchu (TW); International Business Machines Corporation, Armonk, NY (US); Qimonda North America Corp., Cary, NC (US)

( * ) Notice: Subject to any disclaimer, the term of this patent is extended or adjusted under 35 U.S.C. 154(b) by 699 days.

(21) Appl. No.: 11/764,678

(22) Filed: Jun. 18, 2007

(65) Prior Publication Data

US 2008/0191187 A1    Aug. 14, 2008

Related U.S. Application Data

(60) Provisional application No. 60/889,415, filed on Feb. 12, 2007.

(51) Int. Cl.
*H01L 45/00* (2006.01)
(52) U.S. Cl. .................. 438/139; 257/E45.002; 438/102
(58) Field of Classification Search .................. 257/1–5, 257/E47.001, E27.004, E45.002; 365/163; 438/102–103, 139
See application file for complete search history.

(56) References Cited

U.S. PATENT DOCUMENTS

| 3,271,591 A | 9/1966 | Ovshinsky |
| 3,530,441 A | 9/1970 | Ovshinsky |

(Continued)

FOREIGN PATENT DOCUMENTS

WO    WO-00/79539    12/2000

(Continued)

OTHER PUBLICATIONS

Lacaita(phase change memories:State of the art, challenge and perspectives), Solid-States Electronics 50 (2006) 24-31.*

(Continued)

*Primary Examiner* — Matthew W Such
*Assistant Examiner* — Ali Naraghi
(74) *Attorney, Agent, or Firm* — Kenta Suzue; Haynes Beffel & Wolfeld LLP

(57) ABSTRACT

A method for manufacturing a mushroom-cell type phase change memory is based upon manufacturing a pillar of bottom electrode material upon a substrate including an array of conductive contacts in electrical communication with access circuitry. A layer of electrode material is deposited making reliable electrical contact with the array of conductive contacts. Electrode material is etched to form a pattern of electrode pillars on corresponding conductive contacts. Next, a dielectric material is deposited over the pattern and planarized to provide an electrode surface exposing top surfaces of the electrode pillars. Next, a layer of programmable resistive material, such as a chalcogenide or other phase change material, is deposited, followed by deposition of a layer of a top electrode material. A device including bottom electrode pillars with larger bottom surfaces than top surfaces is described.

27 Claims, 10 Drawing Sheets

U.S. PATENT DOCUMENTS

| | | |
|---|---|---|
| 4,599,705 A | 7/1986 | Holmberg et al. |
| 4,719,594 A | 1/1988 | Young et al. |
| 4,876,220 A | 10/1989 | Mohsen et al. |
| 4,959,812 A | 9/1990 | Momodomi et al. |
| 5,166,096 A | 11/1992 | Cote et al. |
| 5,166,758 A | 11/1992 | Ovshinsky et al. |
| 5,177,567 A | 1/1993 | Klersy et al. |
| 5,389,566 A | 2/1995 | Lage |
| 5,515,488 A | 5/1996 | Hoppe et al. |
| 5,534,712 A | 7/1996 | Ovshinsky et al. |
| 5,687,112 A | 11/1997 | Ovshinsky |
| 5,751,012 A | 5/1998 | Wolstenholme et al. |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,920,788 A | 7/1999 | Reinberg |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan et al. |
| 6,025,220 A | 2/2000 | Sandhu |
| 6,031,287 A | 2/2000 | Harshfield |
| 6,034,882 A | 3/2000 | Johnson et al. |
| 6,077,674 A | 6/2000 | Schleifer et al. |
| 6,077,729 A | 6/2000 | Harshfield |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,314,014 B1 | 11/2001 | Lowrey et al. |
| 6,320,786 B1 | 11/2001 | Chang et al. |
| 6,339,544 B1 | 1/2002 | Chiang et al. |
| 6,351,406 B1 | 2/2002 | Johnson et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,507,061 B1 | 1/2003 | Hudgens et al. |
| 6,511,867 B2 | 1/2003 | Lowrey et al. |
| 6,512,241 B1 | 1/2003 | Lai |
| 6,514,788 B2 | 2/2003 | Quinn |
| 6,534,781 B2 | 3/2003 | Dennison |
| 6,545,903 B1 | 4/2003 | Wu |
| 6,555,858 B1 | 4/2003 | Jones et al. |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,579,760 B1 | 6/2003 | Lung et al. |
| 6,586,761 B2 | 7/2003 | Lowrey |
| 6,589,714 B2 | 7/2003 | Maimon et al. |
| 6,593,176 B2 | 7/2003 | Dennison |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,744,088 B1 | 6/2004 | Dennison |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,805,563 B2 | 10/2004 | Ohashi et al. |
| 6,815,704 B1 | 11/2004 | Chen |
| 6,825,489 B2 * | 11/2004 | Kozicki ............................ 257/42 |
| 6,830,952 B2 | 12/2004 | Lung et al. |
| 6,850,432 B2 | 2/2005 | Lu et al. |
| 6,859,389 B2 | 2/2005 | Idehara et al. |
| 6,861,267 B2 | 3/2005 | Xu et al. |
| 6,864,500 B2 | 3/2005 | Gilton |
| 6,864,503 B2 | 3/2005 | Lung et al. |
| 6,867,638 B2 | 3/2005 | Saiki et al. |
| 6,888,750 B2 | 5/2005 | Walker et al. |
| 6,894,305 B2 | 5/2005 | Yi et al. |
| 6,897,467 B2 | 5/2005 | Doan et al. |
| 6,903,362 B2 | 6/2005 | Wyeth et al. |
| 6,909,107 B2 | 6/2005 | Rodgers et al. |
| 6,927,410 B2 | 8/2005 | Chen |
| 6,933,516 B2 | 8/2005 | Xu |
| 6,936,840 B2 | 8/2005 | Sun et al. |
| 6,937,507 B2 | 8/2005 | Chen |
| 6,992,932 B2 | 1/2006 | Cohen et al. |
| 7,018,911 B2 | 3/2006 | Lee et al. |
| 7,023,009 B2 | 4/2006 | Kostylev et al. |
| 7,033,856 B2 | 4/2006 | Lung et al. |
| 7,042,001 B2 | 5/2006 | Kim et al. |
| 7,067,865 B2 | 6/2006 | Lung et al. |
| 7,126,149 B2 | 10/2006 | Iwasaki et al. |
| 7,132,675 B2 | 11/2006 | Gilton |
| 7,166,533 B2 | 1/2007 | Happ |
| 7,214,958 B2 | 5/2007 | Happ |
| 7,220,983 B2 | 5/2007 | Lung |
| 7,385,218 B2 * | 6/2008 | Lee .................................. 257/3 |
| 7,394,089 B2 | 7/2008 | Doyle et al. |
| 7,479,649 B2 * | 1/2009 | Lung .............................. 257/2 |
| 7,485,891 B2 | 2/2009 | Hamann et al. |
| 7,504,653 B2 | 3/2009 | Lung |
| 7,560,337 B2 | 7/2009 | Ho et al. |
| 7,579,613 B2 | 8/2009 | Lung et al. |
| 7,606,059 B2 | 10/2009 | Toda |
| 7,623,370 B2 | 11/2009 | Toda et al. |
| 7,778,063 B2 | 8/2010 | Brubaker et al. |
| 7,868,313 B2 | 1/2011 | Breitwisch et al. |
| 2002/0042158 A1 | 4/2002 | Kersch et al. |
| 2003/0003647 A1 | 1/2003 | Dennison et al. |
| 2003/0215978 A1 | 11/2003 | Maimon et al. |
| 2004/0026686 A1 | 2/2004 | Lung |
| 2004/0051094 A1 | 3/2004 | Ooishi |
| 2004/0114317 A1 | 6/2004 | Chiang et al. |
| 2005/0019975 A1 | 1/2005 | Lee et al. |
| 2005/0029502 A1 | 2/2005 | Hudgens |
| 2005/0093022 A1 | 5/2005 | Lung |
| 2005/0127347 A1 | 6/2005 | Choi et al. |
| 2005/0173691 A1 * | 8/2005 | Lee et al. ........................ 257/2 |
| 2005/0201182 A1 | 9/2005 | Osada et al. |
| 2005/0212024 A1 | 9/2005 | Happ |
| 2005/0215009 A1 | 9/2005 | Cho |
| 2006/0001174 A1 | 1/2006 | Matsui |
| 2006/0003263 A1 | 1/2006 | Chang |
| 2006/0071204 A1 * | 4/2006 | Happ ................................. 257/3 |
| 2006/0077741 A1 | 4/2006 | Wang et al. |
| 2006/0108667 A1 | 5/2006 | Lung |
| 2006/0110878 A1 | 5/2006 | Lung et al. |
| 2006/0118913 A1 | 6/2006 | Yi et al. |
| 2006/0154185 A1 * | 7/2006 | Ho et al. ......................... 430/330 |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |

| | | | |
|---|---|---|---|
| 2006/0286709 A1 | 12/2006 | Lung et al. | |
| 2006/0286743 A1 | 12/2006 | Lung et al. | |
| 2007/0030721 A1 | 2/2007 | Segal et al. | |
| 2007/0045605 A1 | 3/2007 | Hsueh | |
| 2007/0045606 A1 | 3/2007 | Magistretti et al. | |
| 2007/0108077 A1 | 5/2007 | Lung et al. | |
| 2007/0108429 A1 | 5/2007 | Lung | |
| 2007/0108430 A1 | 5/2007 | Lung | |
| 2007/0108431 A1 | 5/2007 | Chen et al. | |
| 2007/0109836 A1 | 5/2007 | Lung | |
| 2007/0109843 A1 | 5/2007 | Lung et al. | |
| 2007/0111429 A1 | 5/2007 | Lung | |
| 2007/0115794 A1 | 5/2007 | Lung | |
| 2007/0117315 A1 | 5/2007 | Lai et al. | |
| 2007/0121363 A1 | 5/2007 | Lung | |
| 2007/0121374 A1 | 5/2007 | Lung et al. | |
| 2007/0126040 A1 | 6/2007 | Lung | |
| 2007/0131922 A1 | 6/2007 | Lung | |
| 2007/0131980 A1 | 6/2007 | Lung | |
| 2007/0138458 A1 | 6/2007 | Lung | |
| 2007/0147105 A1 | 6/2007 | Lung et al. | |
| 2007/0154847 A1 | 7/2007 | Chen et al. | |
| 2007/0155172 A1 | 7/2007 | Lai et al. | |
| 2007/0158632 A1 | 7/2007 | Ho | |
| 2007/0158633 A1 | 7/2007 | Lai et al. | |
| 2007/0158645 A1 | 7/2007 | Lung | |
| 2007/0158690 A1 | 7/2007 | Ho et al. | |
| 2007/0158862 A1 | 7/2007 | Lung | |
| 2007/0161186 A1 | 7/2007 | Ho | |
| 2007/0173019 A1* | 7/2007 | Ho et al. | 438/257 |
| 2007/0173063 A1 | 7/2007 | Lung | |
| 2007/0176261 A1 | 8/2007 | Lung | |
| 2007/0215852 A1* | 9/2007 | Lung | 257/4 |
| 2007/0274121 A1 | 11/2007 | Lung et al. | |
| 2007/0295949 A1* | 12/2007 | Lee | 257/4 |
| 2008/0090324 A1* | 4/2008 | Lee et al. | 438/95 |
| 2008/0116441 A1 | 5/2008 | Raghuram et al. | |
| 2008/0121862 A1* | 5/2008 | Liu | 257/4 |
| 2008/0192534 A1* | 8/2008 | Lung | 365/163 |
| 2009/0148980 A1 | 6/2009 | Yu | |
| 2009/0166600 A1* | 7/2009 | Park et al. | 257/3 |
| 2009/0298223 A1 | 12/2009 | Cheek et al. | |
| 2010/0193763 A1 | 8/2010 | Chen et al. | |
| 2010/0270529 A1 | 10/2010 | Lung | |
| 2010/0291747 A1 | 11/2010 | Lung et al. | |
| 2011/0034003 A1 | 2/2011 | Lung | |

FOREIGN PATENT DOCUMENTS

WO WO-01/45108 6/2001

OTHER PUBLICATIONS

Adler, David, "Amorphous-Semiconductor Devices," Sci. Amer., vol. 236, pp. 36-48, May 1977.

Adler, D. et al., "Threshold Switching in Chalgenid-Glass Thin Films," J. Appl/Phys 51(6), Jun. 1980, pp. 3289-3309.

Ahn, S.J. et al., "A Highly Manufacturable High Density Phase Change Memory og 64 Mb and Beyond," IEEE IEDM 2004, pp. 907-910.

Axon Technologies Corporation paper: Technology Description, pp. 1-6.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000 121 pages.

Chen, et al., "Non-Volatile Resistive Switching for Advanced Memory Applications," IEEE IEDM, Dec. 5-7, 2005, 4 pp.

Cho, S.L. et al., "Highly Scalable On-axis Confined Cell Structure for High Density PRAM beyond 256Mb," 2005 Symposium on VLSI Technology Digest of Technical Papers, pp. 96-97.

Gibson, G.A. et al., "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y.H. et al., "An Edge Contact Type Cell from Phase Change RAM Featuring Very Low Power Consumtion," 2003 Symposium on VSLI Technology Digest of Technical Papers, pp. 175-176.

Happ, T.D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-Change RAM Based on 0.24μm-CMOS Technologies," 2003 Symposium on VLSI Technology Digest of Technical Papers, pp. 173-174.

Iwasaki, Hiroko et al, "completely Erasable Phase Change Optical Disk," Jpn. J. Appl. Phys., Feb. 1992, pp. 461-465, vol. 31.

Jeong, C.W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

"Magnetic Bit Boost," www.sciencenews.org <http://www.sciencenews.org>, Dec. 18 & 25, 2004, p. 389, vol. 166.

Mott, Nevill, "Electrons in Glass," Nobel Lecture, Dec. 8, 1977, Physics, 1977, pp. 403-413.

"New Memories Tap Spin, Gird for Battle," Science News, Apr. 3, 1999, p. 223, vol. 155.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel μTrench Phase-Change Memory Cell for Embedded and Stand-Alone Non-Volatile Memory Applications," 2004 Symposium on VLSI Technology Digest of Technical Papers, pp. 18-19.

Pirovano, Agostino et al., "Reliability Study of Phase-Change Nonvolatile Memories," IEEE Transactions on Device and Materials Reliability, Sep. 2004, pp. 422-427, vol. 4, No. 3.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

"Remembering on the Cheap," www.sciencenews.org <http://www.sciencenews.org>, Mar. 19, 2005, p. 189, vol. 167.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFTs for Vertical Intergration Applications," IEEE Electron Device Letters, vol. 20, No. 7, Jul. 1999.

Wicker, Guy et al., Nonvolatile, High Density, High Performance Phase Change Memory, 1999, 'http://klabs.org/richcontent/MAPLDCon99/Papers/P21_Tyson_P.
PDF#search=nonvolatile%20high%20density%20high%20performance%20phase%20change%20memory<http://klabs.org/richcontent/MAPLDCon99/Papers/P21_Tyson_P.
PDF#search='nonvolatile%20high%20density%20high%20performance%20phase%20change%20memory>', 8 pages.

Wolf, Stanley, Excerpt from: Silicon Processing for the VLSI Era—vol. 4, pp. 674-679, 2004.

Wicker, Guy, "A Comprehensive Model of Submicron Chalcogenide Switching Devices," Doctoral Dissertation, Wayne State University, Detroit, MI, 1996.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

Ahn, S. J. et al., "Highly Reliable 5nm Contact Cell Technology for 256Mb PRAM," VLSI Technology, Digest of Technical Papers, Jun. 14-16, 2005, pp. 98-99.

Chao, D-S. et al., "Low Programming Current Phase Change Memory Cell with Double gst Thermally Confined Structure," VLSI-TSA 2007, International symposium Apr. 23-25, 2007, 2pp.

"Thermal Conductivity of Crystalline Dielectrics". in CRC Handbook of Chemistry and Physics, Internet Version 2007, ($87^{th}$ edition), David R. Lide, ed. Taylor and Francis, Boca Raton, FL.

Schafft, Harry A. et al., "Thermal Conductivity Measurements of Thin Films Silicon Dioxide", Proceedings of the IEEE 1989 International Conference on Microelectronic Test Structures, vol. 2, No. 1, Mar. 1989, pp. 121-124.

"Optimized Thermal Capacitance in a Phase Change Memory Cell Design," IPCOM000141986D, IP.com Prior Art Database, Oct. 18, 2006, 4 pp.

* cited by examiner

METHOD FOR MANUFACTURING A PHASE CHANGE MEMORY DEVICE WITH PILLAR BOTTOM ELECTRODE

REFERENCE TO RELATED APPLICATION

This application claims the benefit of U.S. Provisional Patent Application No. 60/889,415, filed 12 Feb. 2007 by the same co-inventors, entitled Method for Manufacturing a Phase Change Memory Device with Pillar Bottom Electrode, which is incorporated by reference herein.

PARTIES TO A JOINT RESEARCH AGREEMENT

International Business Machines Corporation, a New York corporation; Macronix International Corporation, a Taiwan corporation; and Infineon Technologies A.G., a German corporation, are parties to a Joint Research Agreement.

BACKGROUND OF THE INVENTION

1. Field of the Invention

The present invention relates to methods for manufacturing high density memory devices based on phase change based memory materials, including chalcogenide based materials and other materials, and most particularly to methods for manufacturing a phase change memory element with a pillar-shaped bottom electrode.

2. Description of Related Art

Phase change based memory materials are widely used in nonvolatile random access memory cells. Such materials, such as chalcogenides and similar materials, can be caused to change phase between an amorphous state and a crystalline state by application of electrical current at levels suitable for implementation in integrated circuits. The generally amorphous state is characterized by higher resistivity than the generally crystalline state, which can be readily sensed to indicate data.

The change from the amorphous to the crystalline state is generally a low current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from a crystalline state to amorphous state. The magnitude of the needed reset current can be reduced by reducing the size of the phase change material element in the cell and of the contact area between electrodes and the phase change material, so that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued 11 Nov. 1997; Zahorik et al., "Method of Making Chalogenide [sic] Memory Device," U.S. Pat. No. 5,789,277, issued 4 Aug. 1998; Doan et al., "Controllable Ovonic Phase-Change Semiconductor Memory Device and Methods of Fabricating the Same," U.S. Pat. No. 6,150,253, issued 21 Nov. 2000.

Another memory cell structure under development, referred to sometimes as a mushroom cell because of the shape of the active region on the bottom electrode in a typical structure, is based on the formation of a small electrode in contact with a larger portion of phase change material, and then a usually larger electrode in contact with an opposite surface of the phase change material. Current flow from the small contact to the larger contact is used for reading, setting and resetting the memory cell. The small electrode concentrates the current density at the contact point, so that an active region in the phase change material is confined to a small volume near the contact point. See, for example, Ahn et al., "Highly reliable 50 nm contact cell technology for 256 Mb PRAM," VLSI Technology 2005 Digest of Technical Papers, pages 98-99, 14 Jun. 2005; Denison, International publication No. WO2004/055916 A2, "Phase Change Memory and Method Therefor," Publication Date: 1 Jul. 2004; and Song et al., United States Patent Application Publication No. US 2005/0263829 A1, "Semiconductor Devices Having Phase Change Memory Cells, Electronic Systems Employing the Same and Methods of Fabricating the Same," Publication Date: 1 Dec. 2005.

One prior art technique for making very small bottom electrodes, as described in the Ahn et al. publication, is referred to herein as a plug-in-via process, and includes forming a dielectric fill layer over circuitry for accessing the memory cell, etching vias in the dielectric fill layer to form an opening for making contact to the circuitry, and depositing electrode material into the via. The resulting structure is then planarized to expose the electrode material within the via. The phase change material is deposited and patterned in contact with the electrode. Although this technique is suitable for forming very small bottom electrode structures using plugs in vias, it has proved to suffer reliability and yield issues. For example, as described by Ahn et al., it has proven difficult to form reliable contact with the underlying access circuitry at the bottom of very small vias. This results in some cells in the array permanently disconnected from the access circuits.

Furthermore, Ahn et al. have related that it is difficult to ensure in the plug-in-via process that the areas of the exposed tops of the plug electrodes are uniform after the planarizing step across a large array of such cells. Since the area of the top surface of the bottom electrode affects current density in the phase change material, and is a critical dimension for phase change cells of this type, significant variations in operation of the cells in a single array result. This problem is exacerbated by the techniques used in attempts to successfully fill the vias, including depositing thin films and anisotropic etching of the thin films to form sidewall spacers with the vias. The nature of the process of forming sidewall spacers tends to round off the top edges of the vias, making the plug of electrode material within the via to have a top end with an expanding cross-section. Because it is difficult to planarize the resulting structure uniformly across an entire array within tolerances sufficient to avoid this expanding top end, the etch back will not remove the expanded top end completely for all of the cells and results in a significant variation in size of the exposed top surface of the bottom electrode plugs.

Yet another problem arises in the formation of plug in via electrodes, because of the difficulty of uniformly filling vias. In particular, due to the dynamics of thin film deposition within small holes, the plug that results may include a void where the top of the via closes off before it has been completely filled below. Planarizing the structure may open the void, and creating a hole in the top surface of the electrode plug. Such holes cause problems with successful formation of a layer of phase change material over the electrode.

It is desirable therefore to provide a method for manufacturing of memory cell structure with good control over the critical dimensions of the bottom electrode and over the electrical integrity of connections to the bottom electrode, which is reliable and manufacturable for high density integrated circuit memory devices.

SUMMARY

A method for manufacturing a mushroom-cell type phase change memory is described based upon manufacturing a pillar of bottom electrode material, providing superior uniformity of critical dimensions and electrical connection over the plug-in-via style process. Basically, a process for manufacturing an integrated circuit memory device including a plurality of memory cells as described herein includes providing a substrate including access circuitry for the plurality of memory cells, which has a contact surface with an array of conductive contacts in electrical communication with the access circuitry. A layer of electrode material is deposited conformally over the contact surface making reliable electrical contact with the array of conductive contacts. Electrode material in the layer electrode material is removed to form a pattern of electrode pillars on corresponding conductive contacts in the array of conductive contacts. Pillars in a representative process can be cylindrical with diameters less than about 50 nm. Next, a dielectric material is deposited over the pattern of electrode pillars and contact surface to provide a dielectric fill. The dielectric fill along with the pattern of pillars are planarized to provide an electrode surface exposing top surfaces of the electrode pillars in the pattern of electrode pillars, and such that the layer including the dielectric cell and the pattern of electrode pillars has a substantially uniform thickness across the array. In a representative process, the thickness of this layer including the dielectric fill and pattern of pillars can be less than about 120 nm, and top surfaces of the electrode pillars exposed on the top of the layer at substantially uniform areas less than about 2000 $nm^2$. Next, a layer of programmable resistive material, such as a chalcogenide or other phase change material, is deposited, followed by deposition of a layer of a top electrode material.

The layer of programmable resistive material and the layer of top electrode material are patterned in an exemplary process to define individual memory cells in the array. An embodiment of the process includes forming pads for individual memory cells that comprise portions of the layer of phase change material and of the layer of top electrode material. Then, a layer of dielectric fill material is formed over the pads. Contacts are formed through the layer of dielectric material and a patterned conductor layer is formed, including bit lines, in electrical communication with the top electrodes through the contacts. Alternative processes for completing electrical connections to the top electrodes are also described.

A process for removing electrode material in the layer of electrode material to form a pattern of electrode pillars is described as well. A process for forming a pattern of electrode pillars includes forming an etch mask, using for example a photoresist in a lithographic process, on the layer of electrode material defining a pattern of spots over the conductive contacts in the array of conductive contacts. The lithographic process is followed by trimming the etch mask, using isotropic etching for example, to reduce the size of the spots in the pattern of spots to sub-lithographic dimensions. The electrode material is then anisotropically etched according to the pattern of spots, stopping on the contact surface of the substrate, to produce the pillars.

One variation of the process for manufacturing memory cells includes forming the layer of bottom electrode material using a multilayer stack, including a first layer selected for process compatibility and good electrical connection to the underlying contact, where the first layer may be a material such as titanium nitride when the underlying contact comprises tungsten, and a second layer selected for process compatibility and good electrical connection to the layer of phase change material. In a variation of this process, the second layer comprises a material, such as tantalum nitride when the first layer comprises titanium nitride, which has a higher resistivity than the material of the first layer.

In another variation of the process, a recess is etched in the tops of the electrode pillars prior to deposition of the programmable resistive material. The programmable resistive material fills the recess, creating a region within the programmable resistive material on top of the pillar electrode tending to have higher current density, thereby improving operational characteristics of the memory cell. In yet another variation of the process, the pillar electrodes are tapered, or otherwise shaped, so that after planarizing the bottom surface of the pillar has a larger area than the top surface, improving electrical connection to the pillar and mechanical stability during the manufacturing process, while providing small area contact with the phase change material.

An integrated circuit is described in which bottom electrode pillars have larger area in contact with the underlying contacts to the access circuitry than the area in contact with the programmable resistive material.

Other aspects and advantages of the processes described can be understood with reference to the drawings, the detailed descriptions and the claims which follow.

DETAILED DESCRIPTION

The following detailed description is made with reference to the figures. Those of ordinary skill in the art will recognize a variety of equivalent variations on the description that follows.

With regard to directional descriptions herein, the orientation of the drawings establish their respective frames of reference, with "up," "down," "left" and "right" referring to directions shown on the respective drawings. Similarly, "thickness" refers to a vertical dimension and "width" to the horizontal. These directions have no application to orientation of the circuits in operation or otherwise, as will be understood by those in the art.

Figure 1:
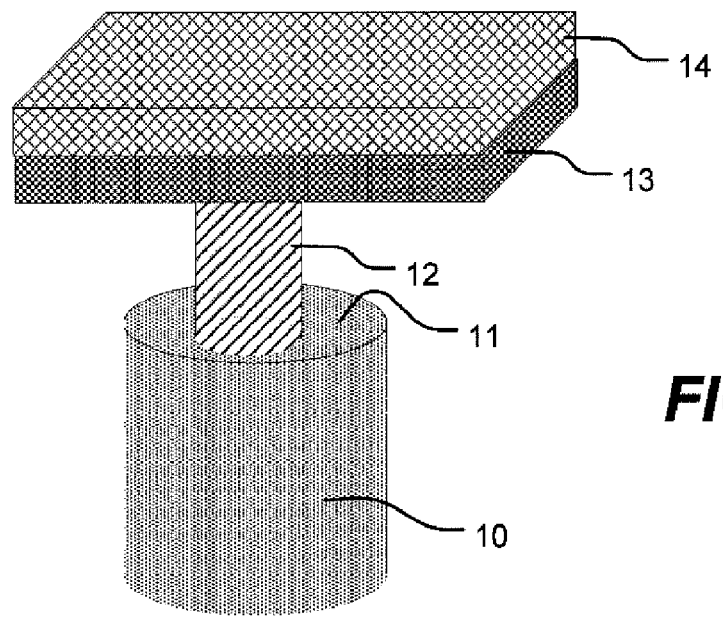
FIG. 1 is a perspective view of a phase change memory cell including a pillar bottom electrode.

FIG. 1 provides a prospective view of the basic structure of a phase change memory cell manufactured as described herein with dielectric fill material removed from the drawing. The memory cell is formed on a contact 10 having a contact surface 11. Contact 10 comprises a "plug" extending through an inter-layer dielectric to underlying access circuitry (not shown), formed using tungsten or another conductive material in the illustrated embodiment. Other contact structures could be utilized as well. A bottom electrode pillar 12 is made on the contact surface 11. The bottom electrode pillar 12 has a very small contact surface on the top. The very small contact surface tends to concentrate current density during operation of the device, allowing low-power operation. A layer 13 of phase change material is formed on the contact surface (not shown) of the bottom electrode pillar 12. A layer 14 of conductive material is formed on the layer 13 of phase change material, to provide a top electrode. The bottom electrode pillar 12 is made using conductive materials such as titanium nitride or other conductive materials, such as TaN, TiAlNi, W, WN, silicides, SiGe, silicon carbide, ruthenium oxide, nickel oxide, iridium oxide, $LaNiO_3$ and other metal oxides and metal nitrides, selected for compatibility with the contact surface 11 and with the phase change material 13, preferably having a resistivity such that the pillar acts as a heater at the top surface in contact with the layer 13 of phase change material.

According to methods described herein, the bottom electrode pillar 12 is manufactured by first depositing a layer of electrode material over the bottom contact, defining the positions of the pillars using a mask, and removing the electrode material from the layer electrode material according to the mask to leave the pillars. This technique allows for reliable contact to the contact surface, uniform pillar structures across a large array, and consistent sizes of the tops of the pillars at which contact to the phase change material is made.

Figure 2:
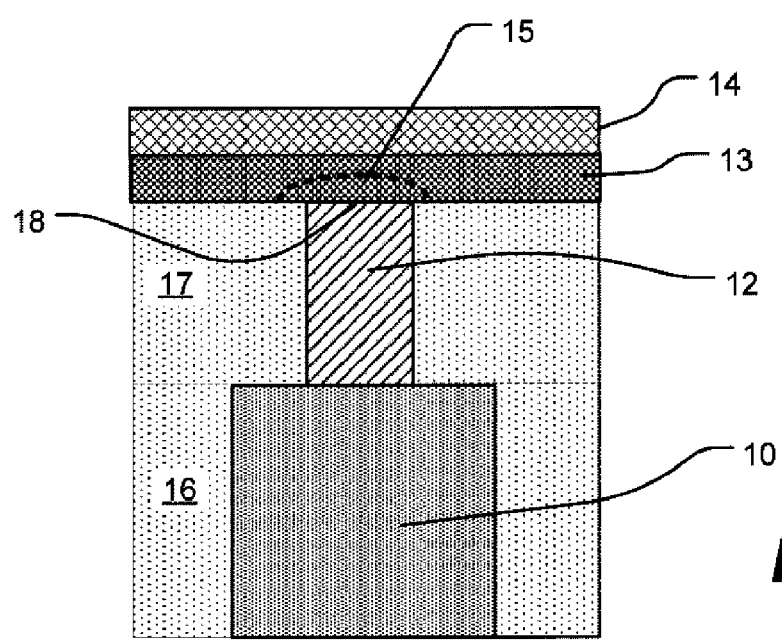
FIG. 2 is a cross-sectional view of a memory cell like that shown in FIG. 1.

FIG. 2 shows a cross-section of the structure of FIG. 1. The basic structure including the contact 10, the bottom electrode pillar 12, the layer 13 of phase change material and the layer 14 of conductive material providing a top electrode are illustrated. The contact surface 18 on the top of the bottom electrode pillar 12 is a small area in which current is concentrated. This results in a small active region 15 in the layer 13 of phase change material, which can be characterized for heuristic purposes as having the shape of the head of a mushroom. Thus, the phase change memory cells of the type shown have been referred to as "mushroom cells." FIG. 2 also illustrates the interlayer dielectric material. The contact 10 in the illustrated embodiment comprises a plug formed in a via in a dielectric layer 16. The dielectric layer comprises for example silicon dioxide, silicon-oxynitride, silicon nitride or other dielectric materials, which separates the phase change memory elements from underlying access circuitry as illustrated in more detail below. The pillar 12 is surrounded by a dielectric layer 17, comprising a dielectric material, such as silicon nitride or silicon-oxynitride in a representative embodiment, which also acts as a diffusion barrier protecting the phase change material and the underlying access circuitry from contamination by elements that might diffuse from other layers in the structure.

The layer 13 of phase change material is composed of a material that is capable of being switched between a first solid state in which the material is in a generally amorphous solid phase, and a second solid state in which the material is in a generally crystalline solid phase in its local order in the active channel region of the cell. Phase change materials are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase.

Some phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states enabling creation of multilevel memory cells capable of storing more than one bit per cell.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy.

Chalcogenides are suitable memory materials for use in embodiments of the invention. Chalcogenides include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column VI of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols. 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference. A material useful for implementation of a PCRAM cell as described herein is $Ge_2Sb_2Te_5$, which is commonly referred to as "GST".

A variety of variations in the structure of the bottom electrode pillar can be implemented. Representative variations are shown in FIGS. 3, 4 and 5, in which the reference numerals used in FIGS. 1 and 2 are used for corresponding structures.

Figure 3:
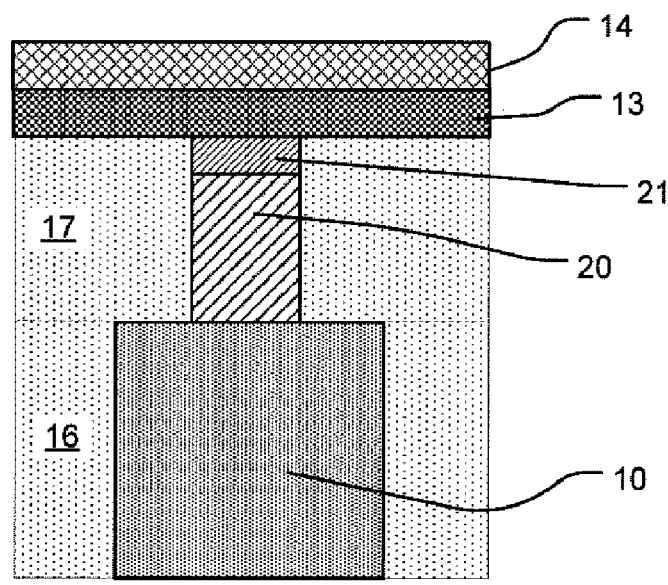
FIG. 3 is a cross-sectional view of an alternative memory cell including a pillar bottom electrode based on a multilayer stack.

FIG. 3 illustrates an embodiment in which the electrode pillar includes the first segment 20 and a second segment 21 formed by a multilayer stack of electrode material. The material used for the first segment 20 is selected for compatibility with the material used for the contact surface 11, and for a relatively lower resistivity than the second segment 21. The material used for the second segment 21 is selected for compatibility with the phase change material 13 and for a relatively higher resistivity than that of the first segment 20. In a representative embodiment, where the contact surface 11 comprises tungsten, the first segment 20 comprises titanium nitride, and the second segment 21 comprises tantalum nitride. The second segment 21 act as a "heater" because of its higher resistivity, inducing the greater temperature change for a given current flow than would otherwise occur, improving the efficiency of the phase change cycle in the phase change material 13.

Figure 4:
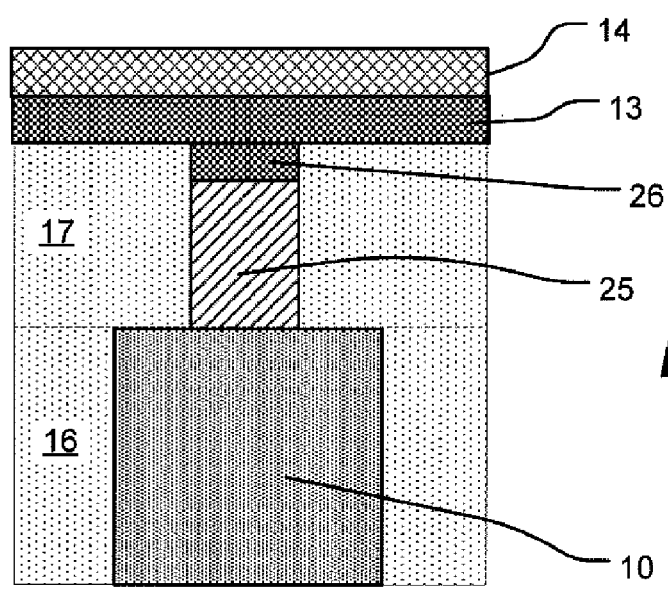
FIG. 4 is a cross-sectional view of an alternative memory cell including phase change material deposited within a recess on top of the pillar bottom electrode.

FIG. 4 illustrates another embodiment, in which the electrode pillar comprises a first segment 25 comprising a conductor such as titanium nitride, and the second segment 26 comprises a phase change material, such as the same phase change material as used for the layer 13. In some embodiments, the phase change material in the segment 26 is not the same as that used in the layer 13. This structure can be made by etching a recess on the top of the bottom electrode pillar, after planarization. Then when the layer 13 of phase change material is deposited, the recess is filled. In this embodiment, the current flow is further confined by the segment 26 of phase change material, tending to decrease the volume of the active region in the memory cell.

Figure 5:
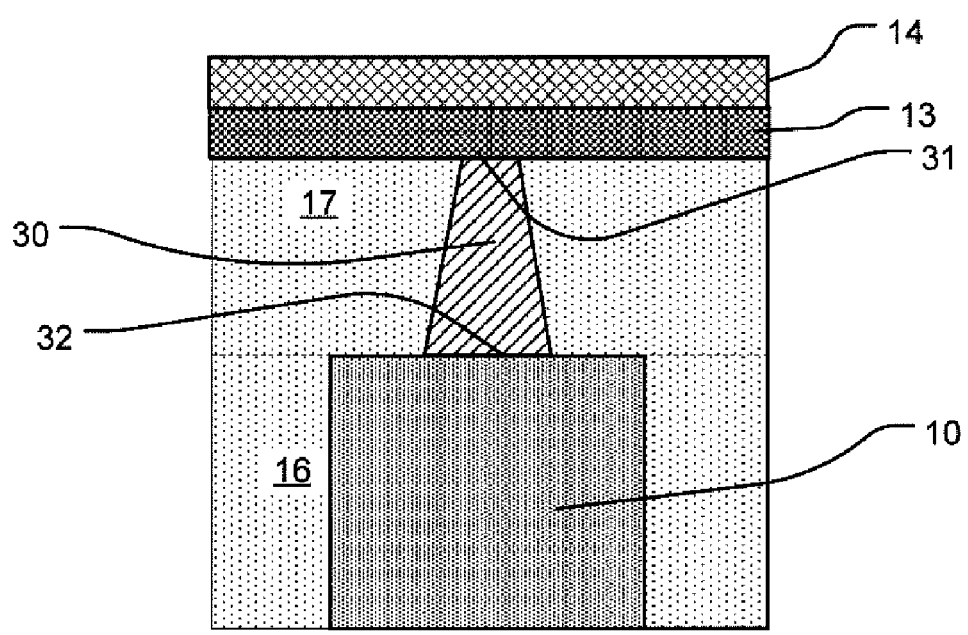
FIG. 5 is a cross-sectional view of an alternative memory cell including a pillar bottom electrode having a larger surface on the bottom than on the top.

FIG. 5 illustrates yet another embodiment, in which the bottom surface 32 of the bottom electrode pillar has a larger area in contact with the underlying contact 10 to the access circuitry than does the top surface 31 of the electrode pillar in contact with the patch of programmable resistive material. FIG. 5 illustrates a smooth, conical taper in the pillar. Of course, pillars with larger bottom surfaces than top surfaces can have other shapes. In this manner, the larger bottom surface results in a structure that is more robust during handling before and during deposition of the dielectric fill layer 17, and provides for more reliable and less resistive electrical connection to the contact surface of the underlying contact 10. At the same time, the top surface 31 of the electrode pillar 30 can be made quite small, further concentrating current flow for the operation of the phase change material. One process for forming a tapered pillar includes using a mask structure that is also tapered, and etching in a manner that transfers the tapered shape to the bottom electrode material. An embodiment of an electrode pillar having this structure may have at least 30% greater area on the bottom than on the top for example. Of course, embodiments can be implemented with any amount of difference in the areas, including as little as a few percent greater, and as much as for example twice greater, on the bottom for example, in order to accomplish one or more of the goals described above.

Figure 6:
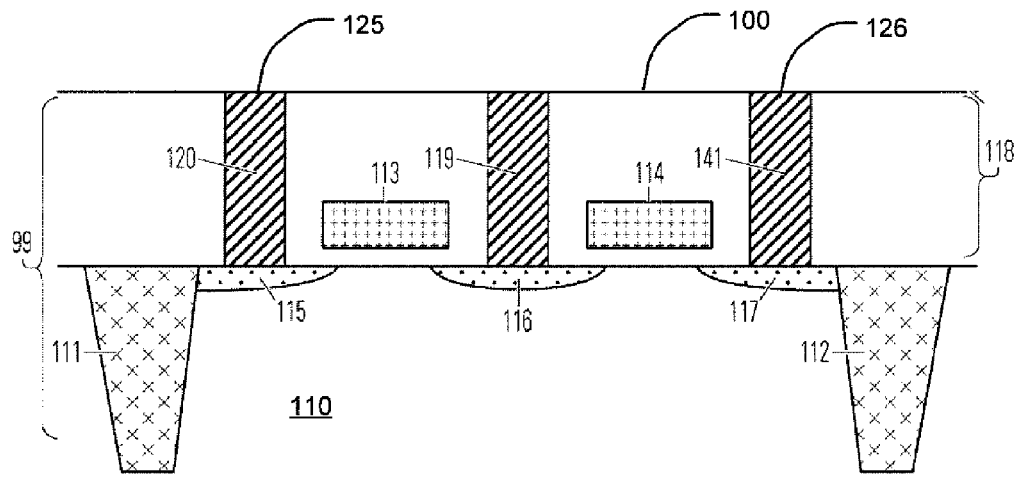
FIG. 6 is a cross-sectional view of a substrate having a contact surface with an array of contacts in communication with access circuitry, in a first stage of a manufacturing process for making pillar bottom electrode, phase change memory cells.

FIGS. 6-15 illustrate a sequence of stages in a representative process for manufacturing a bottom electrode pillar phase change memory cell such as described above with reference to FIGS. 1-5. FIG. 6 illustrates a first stage in the manufacturing process, after typical CMOS processing techniques have been applied, in which a substrate 99 that includes access circuitry has been made. Access circuitry is formed on a semiconductor substrate 110. Isolation structures such as shallow trench isolation STI dielectric trenches 111 and 112 isolate pairs of rows of memory cell access transistors in this example. The access transistors are formed by common source region 116 in the substrate 110, and drain regions 115 and 117 in the substrate 110. Polysilicon word lines 113 and 114 form the gates of the access transistors. The dielectric fill layer 118 is formed over the polysilicon word lines 113, 114. Contact plug structures 141 and 120 contact individual access transistor drains 115 and 117. Common source line 119 contacts source regions along a row in the array. The common source line 119 contacts the common source region 116. The substrate 99 including access circuitry for a plurality of memory cells, has a contact surface 100 with an array of conductive contacts 125, 126 on the top contact surfaces of the contact plugs 120 and 141 which are in turn connected to the access circuitry. Other configurations of access circuitry can be used as well, including configurations using diodes rather than transistors.

Figure 7:
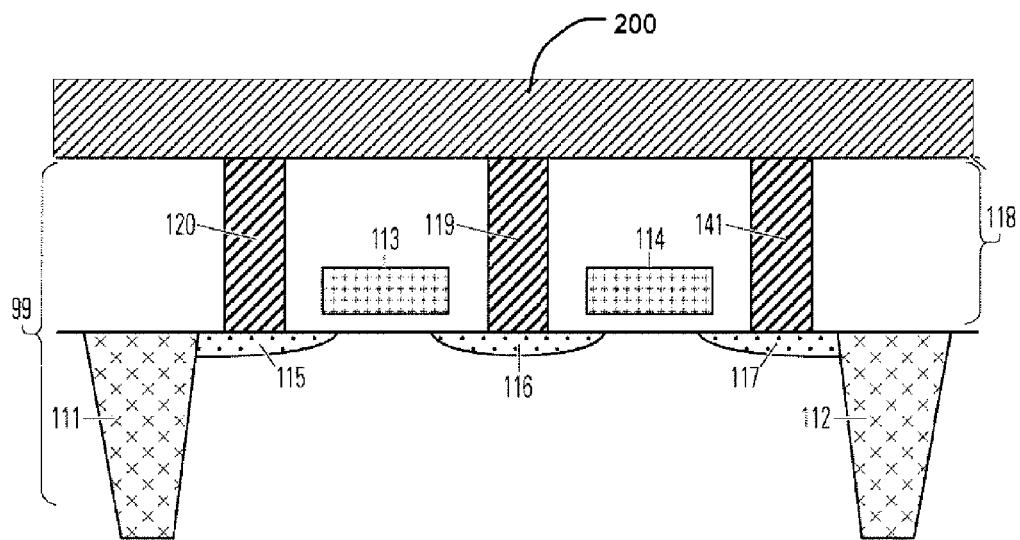
FIGS. 7-15 illustrate successive stages in a manufacturing process for making pillar bottom electrode, phase change memory cells.

FIG. 7 illustrates the next stage in the manufacturing process, after a layer 200 of electrode material has been deposited on the contact surface of the substrate 99. Depending on the embodiment of the bottom electrode pillar desired, the layer 200 of electrode material may comprise a multilayer stack of conductive metals, alloys, semiconductors, phase change material and the like. In a representative embodiment, the bottom electrode pillar comprises a single layer pillar of titanium nitride, deposited on the contact surface 100 of the substrate using a method such as such as physical or chemical vapor deposition. The thickness of the layer 200 is chosen to be slightly greater than the height of the bottom electrode pillars desired to be made in the embodiment being described.

Figure 8:
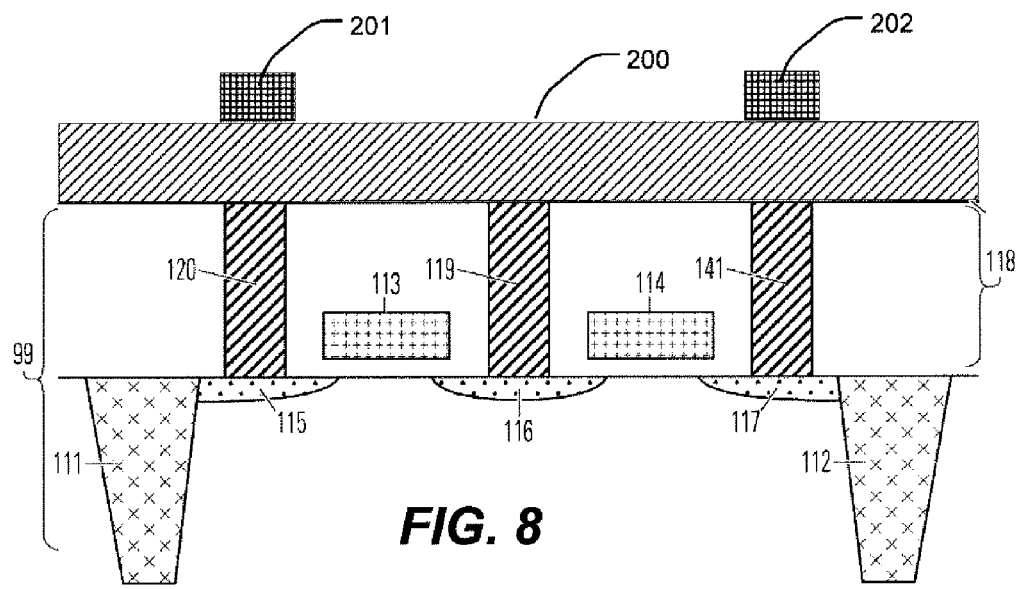

FIG. 8 illustrates a next stage in the manufacturing process after the deposition and patterning of a layer of photoresist to provide mask structures 201, 202 which define the location of pillars over the conductive plugs 120 and 141. The deposition and patterning of photoresist can be implemented using standard photo lithographic techniques, including phase shift masking and other advance patterning techniques to form an array of small spots on the layer 200 of electrode material.

Figure 9:
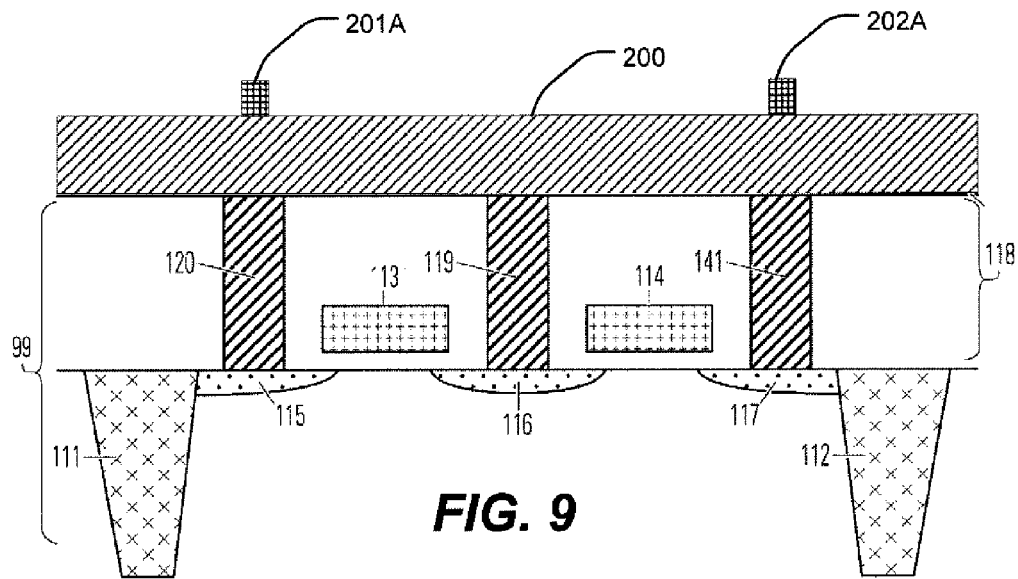

FIG. 9 illustrates a next stage after etching the mask structures 201, 202 to provide trimmed mask structures 201A and 202A, which have sub-lithographic dimensions. For example, the photoresist mask structures 201 and 202 can be isotropically etched in order to narrow and thin the structures to form spots having a diameter less than 50 nm on the order of 30 nm or less in some embodiments. Photoresist trimming is applied for example using an oxygen plasma to isotropically etch the photoresist, which trims its width and thickness. In an alternative, a hard mask layer, such as a low temperature deposited layer of $SiN_x$ or $SiO_2$ can be defined using photolithography to define a pattern, followed by trimming using an isotropic wet etch, such as dilute HF for silicon dioxide or hot phosphoric acid for silicon nitride, or isotropic fluorine or HBr based reactive ion etching REI etching.

Figure 10:
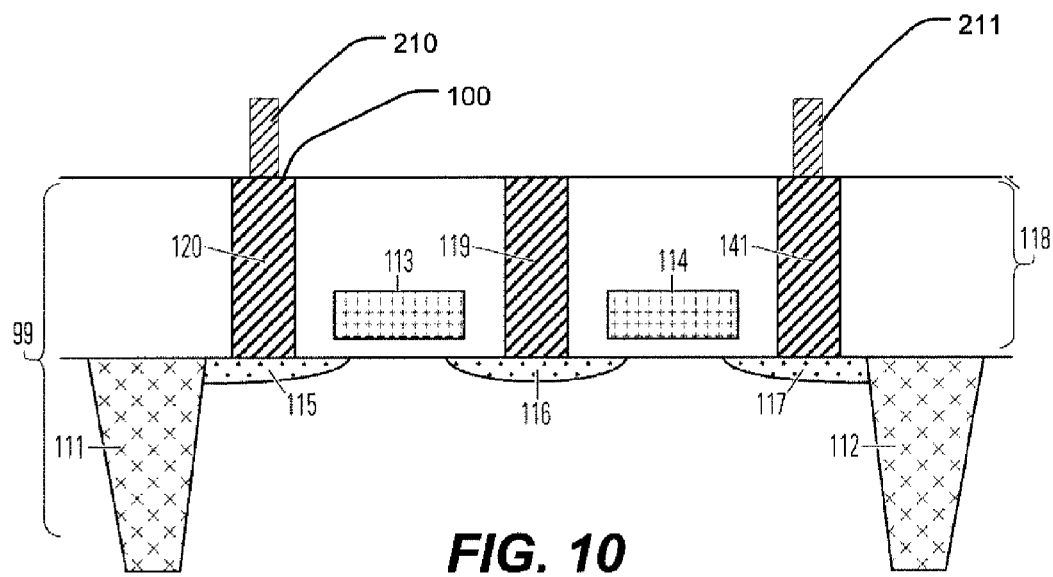

FIG. 10 illustrates a next stage after etching the layer 200 of electrode material to form preliminary electrode pillars 210 and 211 on the contact surface 100 over the plugs 120 and 141. A variety of etching recipes can be utilized to form uniform plugs having a consistent diameter over a large array of structures. For example, a layer of TiN can be etched using REI with a chlorine based plasma, and a layer of TaN can also be etched using REI with a chlorine based plasma. An alternative process for forming a layer of heater material on top of a layer of TiN or other metal, includes first forming a pillar as described above, then filling and polishing back using chemical mechanical polishing CMP, for example, to expose a top surface of the pillar. The top surface of the pillar can be recessed using an REI with reduced ion energy to slowly recess the top surface without substantial damage to the dielectric. The heater material is then deposited in a blanket over the resulting structure, and etched back again by CMP, to provide a heater layer on top of the electrode pillar. A similar process can be used for the embodiment of FIG. 4, using a GST blanket deposit. For the embodiment of FIG. 5, a tapered pillar can be formed using a hard mask of silicon nitride on TiN for example, by a chlorine based REI etch with oxygen added to the etch chemistry that will laterally attack the hard mask slowly during the vertical etch of the electrode material, causing a sloped profile for the pillar.

Figure 11:
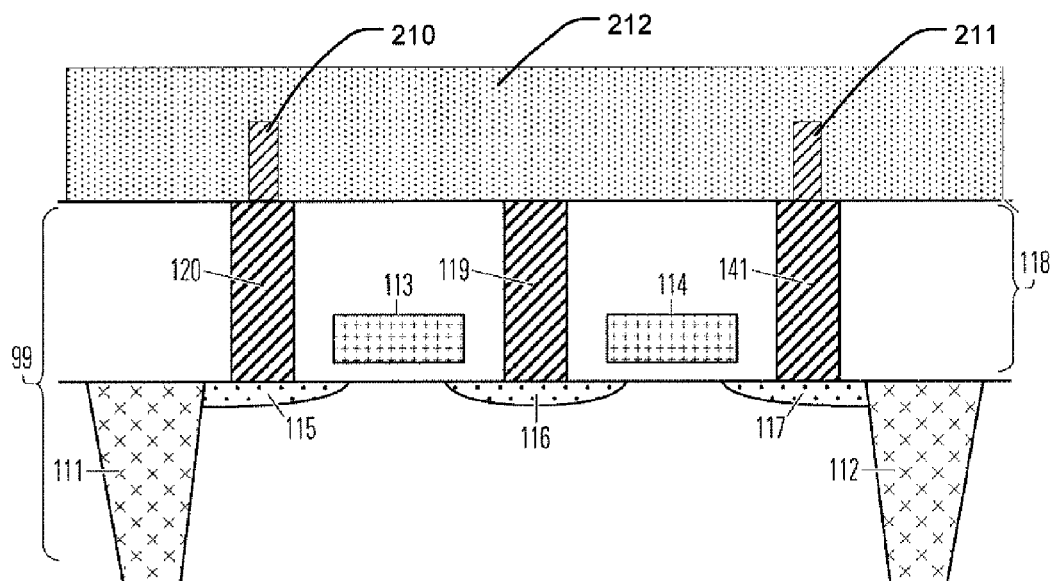

FIG. 11 illustrates the following stage after formation of the dielectric fill layer 212 over the preliminary pillar structures 210, 211. The dielectric fill comprises silicon nitride or siliconoxy nitride or related dielectric materials deposited using a techniques such as high-density plasma chemical vapor deposition, based on silane and $O_2$ at 400 to 450 C, for SiN, add ammonia in silane, for oxynitride use ammonia, silane and oxygen. The material of layer 212 also acts as a diffusion barrier.

Figure 12:
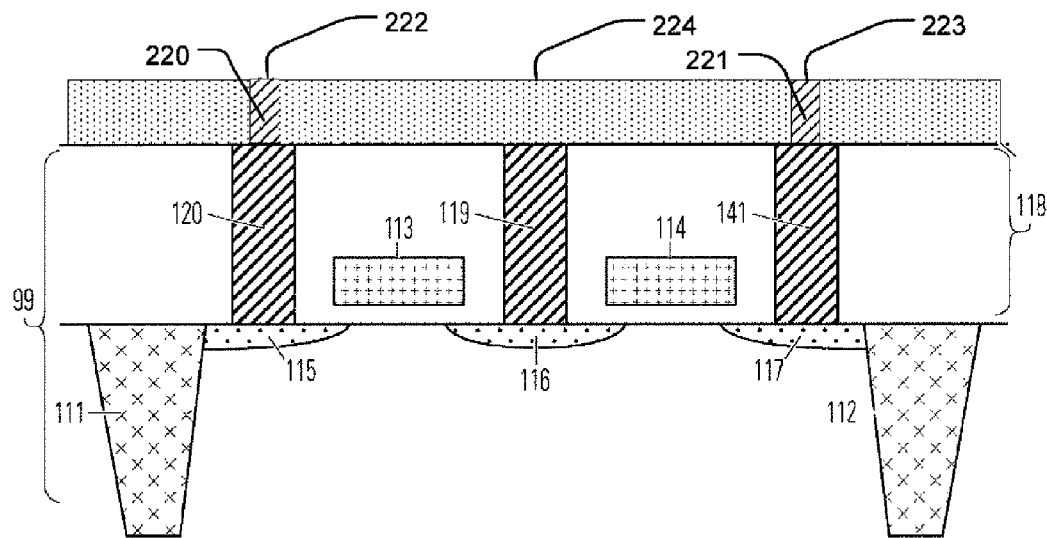

FIG. 12 illustrates the result of a following step, in which the dielectric fill layer 212 and the preliminary pillars are etched back using a planarizing process such as chemical mechanical polishing to form pillar structures to 220 and 221 having a top surfaces 222 and 223 respectively exposed at a planar top surface 224 of the dielectric layer 212. A dielectric CMP process is chosen. During the CMP process, the thickness of the layer 212 is monitored using for example an ellipsometer, an interferometer or other non-destructive tool. As a result of this process, the areas of the top surfaces 222 and 223 of the bottom electrode pillars 220 and 221 are highly consistent across the large array of memory cells. In a representative process, the resulting pillars are about 40 to 120 nm high, preferably about 60 nm, and vary in height across the pattern of pillars by less than 10%.

Figure 13:
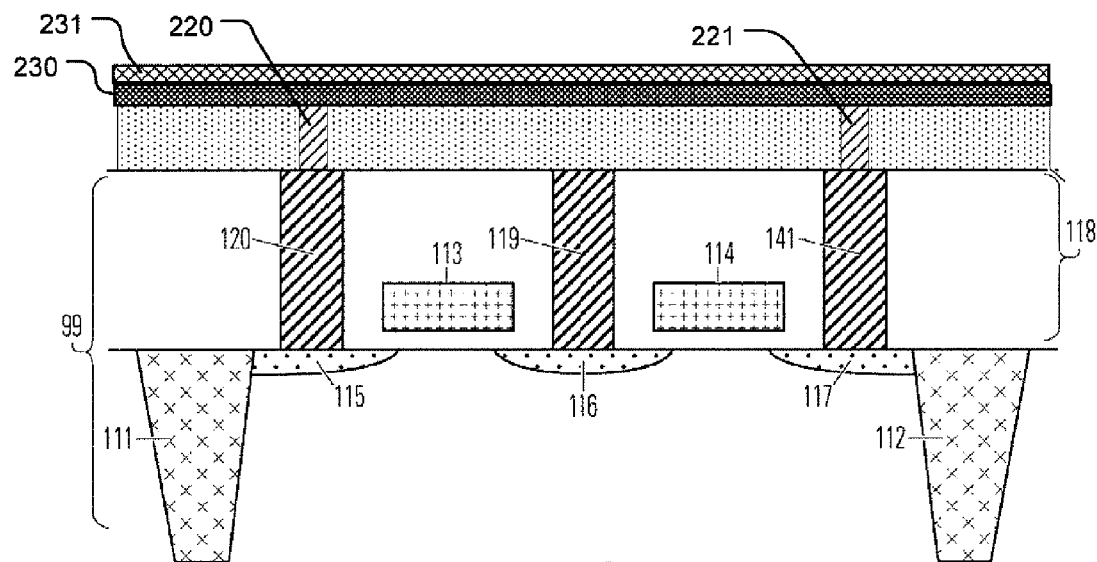

FIG. 13 illustrates a following stage after deposition of a layer 230 of phase change material having a thickness of about 40 to 140 nm high, preferably about 100 nm, followed by deposition of the layer 231 of top electrode material having a thickness, for example, of about 40 to 80 nm. The top electrode material is chosen for conductivity and compatibility with the phase change material. In a representative embodiment, the phase change material comprises GST as described above, and the top electrode material comprises titanium nitride, or other metals, metal oxides and metal nitrides. In this step, the deposition of the conformal layer 230 of phase change material on the surface 224 of the dielectric fill 212 forms reliable electrical connection with the top surfaces of the pillars 220 and 221.

An exemplary method for forming chalcogenide material uses PVD-sputtering or magnetron-sputtering method with source gas(es) of Ar, $N_2$, and/or He, etc. at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. Also, the combination of DC bias and the collimator can be used simultaneously.

A post-deposition annealing treatment in vacuum or in an $N_2$ ambient is optionally performed to improve the crystallization state of chalcogenide material. The annealing temperature typically ranges from 100° C. to 400° C. with an anneal time of less than 30 minutes.

Figure 14:
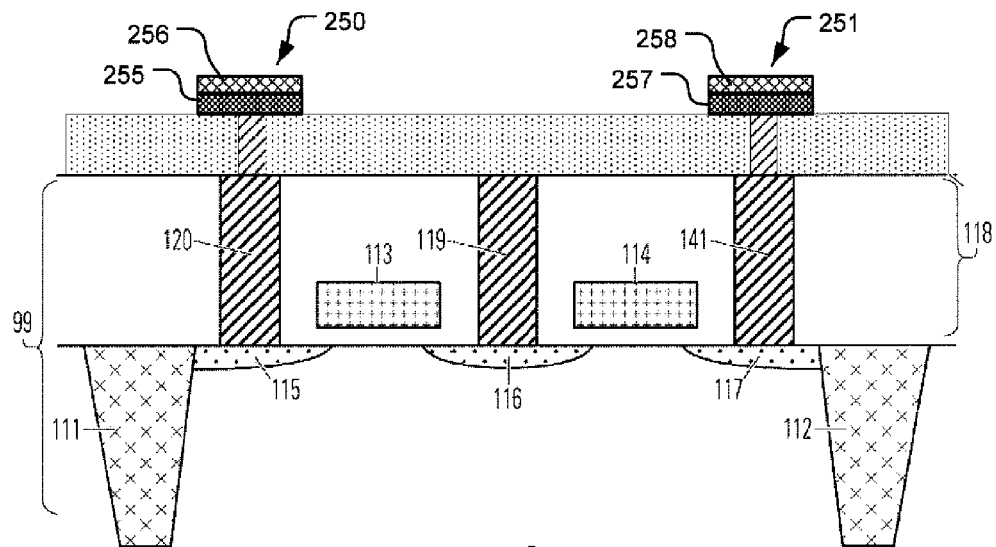

FIG. 14 shows a result of photolithographic patterning and etching of the layer 230 of phase change material and layer 231 of top electrode material to form pads for individual cells 250, 251 which consist of a patch 255 of phase change material covered by a patch 256 of top electrode material having a dimension on the order of the minimum feature size of the lithographic processes in the manufacturing. Thus as a result of the patterning step, an array of memory cells is formed having a bottom electrode pillar, such as pillar 220, a layer of phase change material such as patch 255, and a top electrode layer such as patch 256.

Figure 15:
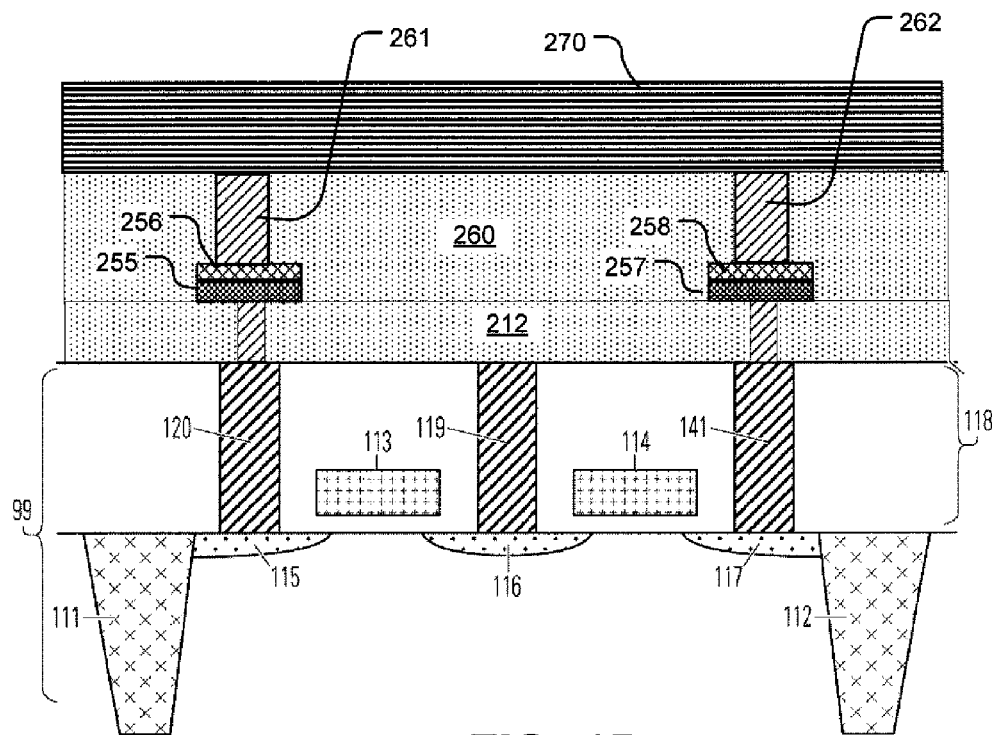

FIG. 15 illustrates a following stage in the manufacturing after a number of steps to complete the access circuitry. The steps include deposition of a dielectric fill layer 260 over the individual cells 250, 251. The dielectric fill layer 260 is formed for example by high-density plasma HDP chemical vapor deposition CVD, followed by chemical mechanical polishing and cleaning. The dielectric fill layer 260 may comprise silicon oxides, silicon nitrides, and other insulating materials, preferably having good thermal as well as electrical insulating properties. In a following step, vias are formed and filled with plugs 261, 262 in contact with the top electrode patches 256, 258 and each of the individual cells in the array. In a representative embodiment, the plugs 261, 262 comprise tungsten plugs having a diameter on the order of the minimum feature size of the lithographic process used. The formation of the plugs 261, 262 is followed by deposition of a patterned conductor layer 270. In embodiments of the process, a copper alloy damascene metallization process is used in which the patterned conductive layer 270 is formed by depositing fluorosilicate glass (FSG) on the exposed surface, and then forming a photoresist pattern in the pattern desired. An etch is applied removing exposed FSG, and then liner and seed layers are deposited in the pattern. Then, copper plating is applied to fill the pattern. After plating, an anneal step is applied, followed by a polishing process. Other embodiments can use standard Al—Cu processes, or other metallization processes known in the art.

Figure 16:
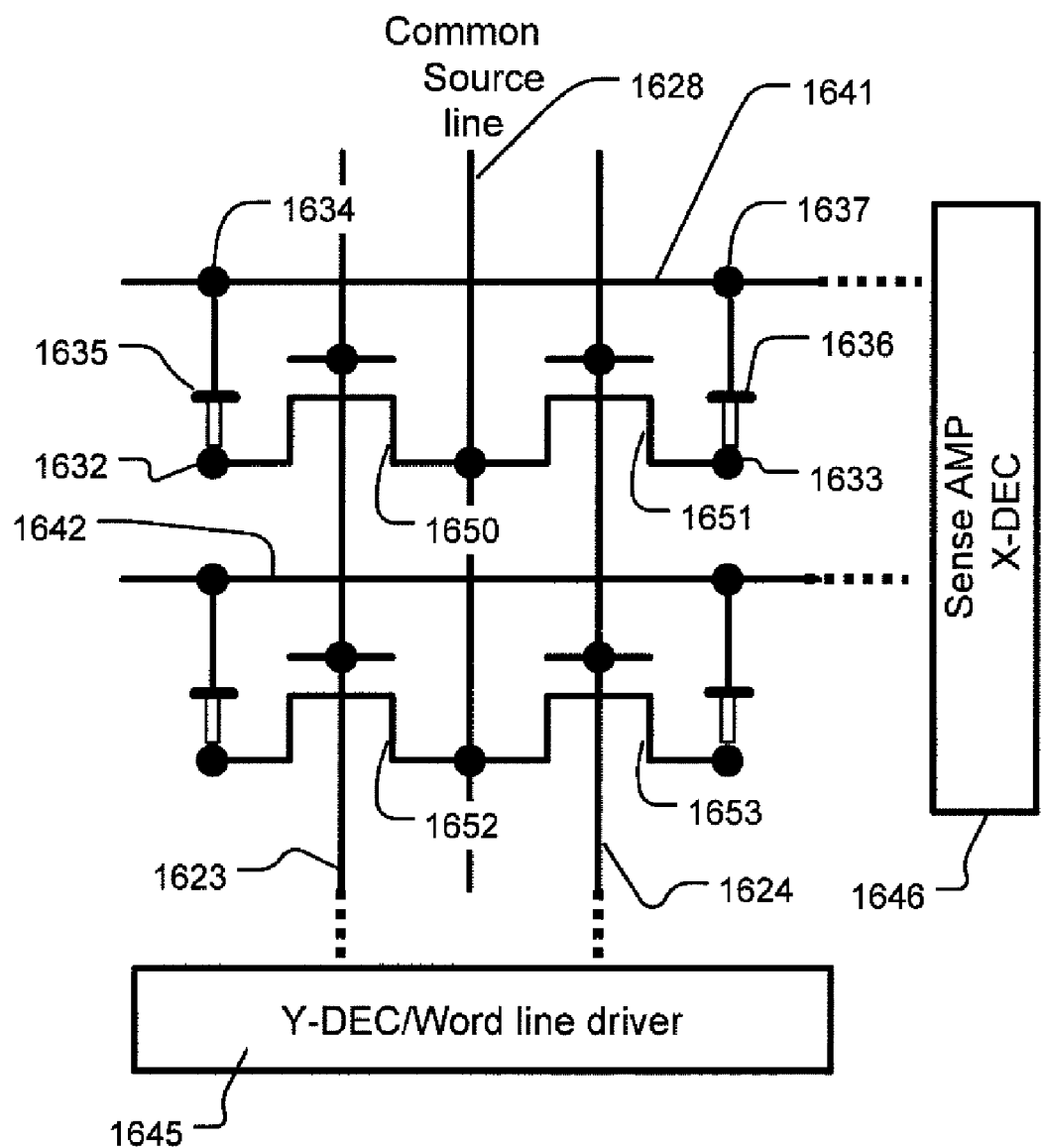
FIG. 16 provides a simplified to circuit diagram for an array of pillar bottom electrode, phase change memory cells.

FIG. 16 shows a circuit diagram for a basic array structure for memory cells having pillar bottom electrodes as described herein. Each memory cell in an array of the type shown includes an access transistor (or other access device such as a diode), four of which are shown as 1650, 1651, 1652, 1653, and a phase change element, shown as 1635, 1636 in cells coupled to access transistors 1650 and 1651. Sources of each of access transistors 1650, 1651, 1652, 1653 are connected in common to a source line 1628. In another embodiment the source lines of the select devices are not electrically connected, but independently controllable. Word lines 1623 and 1624 extend parallel along a first direction. Word lines 1623 and 1624 are in electrical communication with word line decoder 1645 labeled as a "Y-Decoder" in the figure because of the orientation shown. The gates of access transistors 1650 and 1652 are connected to a common word line 1623, and the gates of access transistors 1651 and 1653 are connected in common to word line 1624. Bit line 1641 is connected to the top electrodes of phase change elements 1635 and 1636. Bit line 1642 is connected to the phase change elements which are coupled to the access transistors 1652 and 1653. The bit lines 1641 and 1642 are coupled to the sense amplifiers and decoder 1606, labeled as any "X-decoder" because of the orientation of the figure. The pillar bottom electrodes of phase change elements 1635 and 1636 are coupled to the drains 1632, 1633 of transistors 1650 and 1651, respectively. It should be noted that four memory cells are shown for convenience of discussion and in practice the array may be much larger.

Figure 17:
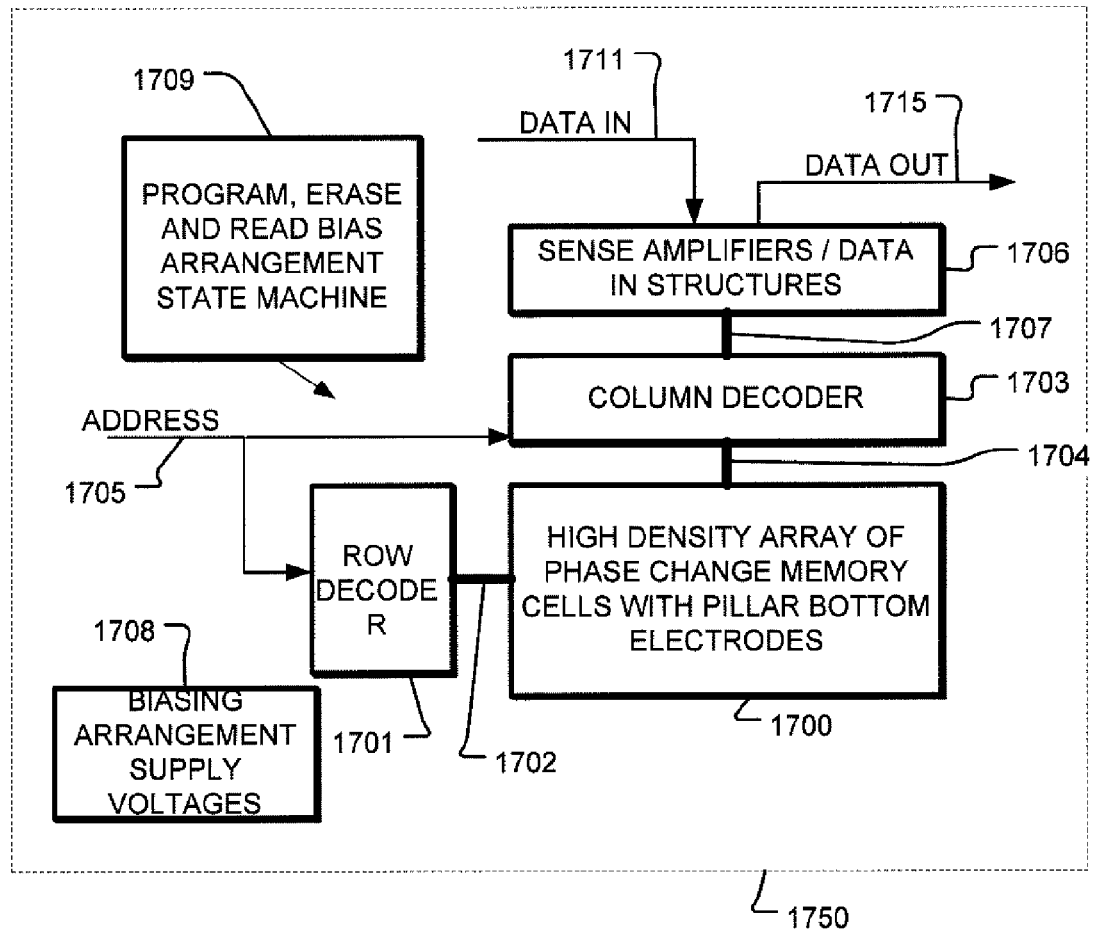
FIG. 17 is a block diagram of an integrated circuit device including an array of pillar bottom electrode, phase change memory cells.

Referring to FIG. 17, shown is a simplified block diagram of an integrated circuit 1750 including an array 1700 of phase change memory cells with pillar bottom electrodes as described herein. Circuit 1750 includes a memory array 1700 implemented using phase change memory cells having pillar bottom electrodes. The array 1700 may comprise many millions of cells. A word line or row decoder 1701 is in electrical communication with a plurality of word lines 1702. A bit line or column decoder 1703 is in electrical communication with a plurality of bit lines 1704 to read data from, and write data to, the phase change memory cells in array. Addresses are supplied on bus 1705 to word line decoder 1701 and bit line decoder 1703. Sense amplifiers and data-in structures in block and thousand 506 are coupled to bit line decoder 1703 via data bus 1707. Data is supplied via a data-in line 1711 from input/output ports on integrated circuit 1750, or from other data sources internal or external to integrated circuit 1750, to data-in structures in block 1706. Other circuitry (not shown) may be included on integrated circuit 10, such as a general purpose processor or special purpose application circuitry, or a combination of modules providing system-on-a-chip functionality supported by array 1700. Data is supplied via a data-out line 1715 from the sense amplifiers in block 1706 to input/output ports on integrated circuit 1750, or to other data destinations internal or external to integrated circuit 1750.

A controller 1709 implemented in this example, using a bias arrangement state machine, controls the application of bias arrangement supply voltages 1708, such as read, program, erase, erase verify and program verify voltages. Controller 1709 may be implemented using special-purpose logic circuitry as known in the art. In alternative embodiments, controller 1709 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 1709.

The invention has been described with reference to phase change materials. However, other memory materials, also sometimes referred to as programmable materials, can also be used. As used in this application, memory materials are those materials having electrical properties, such as resistance, that can be changed by the application of energy; the change can be a stepwise change or a continuous change or a combination thereof. Other programmable resistive memory materials may be used in other embodiments of the invention, including $N_2$ doped GST, $Ge_xSb_y$, or other material that uses different crystal phase changes to determine resistance; PrxCayMnO3, PrSrMnO, ZrOx, or other material that uses an electrical pulse to change the resistance state; TCNQ, PCBM, TCNQ-PCBM, Cu-TCNQ, Ag-TCNQ, C60-TCNQ, TCNQ doped with other metal, or any other polymer material that has bistable or multi-stable resistance state controlled by an electrical pulse. Further examples of programmable resistive memory materials include GeSbTe, GeSb, NiO, Nb—SrTiO3, Ag—GeTe, PrCaMnO, ZnO, Nb2O5, Cr—SrTiO3.

Those in the art will understand that a variety of alternatives and embodiments can be fashioned, all lying within the spirit of the invention disclosed herein.

What is claimed is:

1. A method for manufacturing a plurality of memory cells, comprising:

providing a substrate including access circuitry for the plurality of memory cells, and having a contact surface with an array of conductive contact plugs connected to the access circuitry;

adding a layer of bottom electrode material on the contact surface of the contact plugs of the substrate;

forming electrode pillar masks only partly covering the bottom electrode material, and isotropically trimming electrode pillar masks on the layer of bottom electrode material;

removing material of the layer of bottom electrode material to form a pattern of electrode pillars on corresponding conductive contact plugs in the array of conductive contact plugs;

forming a layer of dielectric material covering the pattern of electrode pillars and exposed portions of the contact surface;

planarizing layer of dielectric material and electrode pillars to provide an electrode surface exposing tops of the electrode pillars in the pattern of electrode pillars, wherein the electrode pillars have pillar horizontal cross-sectional areas from the tops to bottoms of the electrode pillars;

forming a layer of programmable resistive material on the electrode surface;

forming a layer of top electrode material over the layer of programmable resistive material; and patterning the layer of programmable resistive material and the layer of top electrode material, the programmable resistive material having programmable resistive material horizontal cross-sectional areas from tops to bottoms of the patterned programmable resistive material, wherein all the pillar horizontal cross-sectional areas of a particular electrode pillar, are bounded by any of the programmable resistive material horizontal cross-sectional areas of a particular programmable resistive material element coupled to the particular electrode pillar.

2. The method of claim 1, said forming and trimming, including forming a mask on the layer of bottom electrode material defining a pattern of spots, including lithographically defining a lithographic pattern including etch mask patches over the conductive contact plugs in the array of conductive contact plugs, and trimming the etch mask patches to produce a pattern of spots having sub-lithographic dimensions, and wherein said removing includes anisotropically etching the layer of bottom electrode material to remove material not covered by the pattern of spots.

3. The method of claim 1, wherein the layer of bottom electrode material includes a stack of materials, including a first material suitable for electrical contact with the programmable resistive material and a second material suitable for electrical contact with the array of contacts.

4. The method of claim 3, wherein the first material has resistivity higher than that of the second material.

5. The method of claim 1, wherein the layer of bottom electrode material includes a stack of materials, including a first material suitable for electrical contact with the programmable resistive material, and a second material having a lower resistivity than the first material.

6. The method of claim 1, wherein the programmable resistive material comprises a material that is switchable by application of heat or electric current between at least two solid phases.

7. The method of claim 1, wherein the bottom electrode material comprises TiN.

8. The method of claim 1, wherein said bottom electrode pillar has a bottom surface in contact with the contacts in the array of contacts and a top surface in contact with the layer of phase change material, and the bottom surface has a larger area than the top surface.

9. The method of claim 1, including during said planarizing, monitoring thickness of the dielectric layer, and stopping the planarizing upon detection of a predetermined thickness.

10. The method of claim 1, including after said planarizing, selectively removing a portion of the top of the electrode pillar to form a recess on top of the electrode pillar, and wherein the formation of the layer of phase change material includes filling the recess with phase change material.

11. The method of claim 1, wherein patterning the layer of programmable resistive material and the layer of top electrode material includes forming pads comprising portions of the layer of phase change material and of the layer of top electrode material for individual memory cells, applying a layer of dielectric fill material over the pads, forming contacts through the layer of dielectric fill material, and forming a patterned conductor layer including bit lines in electrical communication with the contacts.

12. A method for manufacturing a plurality of memory cells, comprising:
  providing a substrate including access circuitry for the plurality of memory cells, and having a contact surface with an array of conductive contact plugs connected to the access circuitry;
  adding a layer of bottom electrode material on the contact surface of the contact plugs of the substrate;
  forming electrode pillar masks only partly covering the bottom electrode material, and isotropically trimming electrode pillar masks on the layer of bottom electrode material;
  removing material of the layer of bottom electrode material to form a pattern of electrode pillars on corresponding conductive contact plugs in the array of conductive contact plugs, wherein the electrode pillars have respective bottom surfaces in electrical connection with corresponding conductive contact plugs in the array of conductive contact plugs;
  forming a layer of dielectric diffusion barrier material covering the electrode pillars in the pattern of electrode pillars and the contact surface;
  planarizing layer of dielectric diffusion barrier material and electrode pillars to provide a bottom electrode layer having a thickness less than about 120 nm with an electrode surface exposing top surfaces of the electrode pillars in the pattern of electrode pillars, so that the respective top surfaces of the electrode pillars in the pattern of pillars have areas less than about 2000 $nm^2$ and are substantially uniform over the pattern of pillars;
  forming a layer of programmable resistive material on the electrode surface, the programmable resistive material comprising a phase change material having a thickness less than about 120 nm;
  forming a layer of top electrode material over the layer of programmable resistive material; and
  patterning the layer of programmable resistive material and the layer of top electrode material at a same time.

13. The method of claim 12, said forming and trimming, including forming a mask on the layer of bottom electrode material defining a pattern of spots, including lithographically defining a lithographic pattern including etch mask patches over the conductive contact plugs in the array of conductive contact plugs, and trimming the etch mask patches to produce a pattern of spots having sub-lithographic dimensions, and wherein said removing includes anisotropically etching the layer of bottom electrode material to remove material not covered by the pattern of spots.

14. The method of claim 12, wherein the layer of bottom electrode material includes a stack of materials, including a first material suitable for electrical contact with the programmable resistive material and a second material suitable for electrical contact with the array of contacts.

15. The method of claim 14, wherein the first material has resistivity higher than that of the second material.

16. The method of claim 12, wherein the layer of bottom electrode material includes a stack of materials, including a first material suitable for electrical contact with the programmable resistive material, and a second material having a lower resistivity than the first material.

17. The method of claim 12, wherein the bottom electrode material comprises TiN.

18. The method of claim 12, wherein electrode pillars in the array of electrode pillars have respective bottom surfaces in contact with corresponding contacts in the array of contacts, and the bottom surfaces have larger areas than the top surfaces.

19. The method of claim 12, including during said planarizing, monitoring thickness of the dielectric layer, and stopping the planarizing upon detection of a predetermined thickness less than about 120 nm.

20. The method of claim 12, including after said planarizing, selectively removing a portion of the top of the electrode pillar to form a recess on top of the electrode pillar, and wherein the formation of the layer of phase change material includes filling the recess with phase change material.

21. The method of claim 12, wherein patterning the layer of programmable resistive material and the layer of top electrode material included forming pads comprising portions of the layer of phase change material and of the layer of top electrode material for individual memory cells, applying a layer of dielectric fill material over the pads, forming contacts through the layer of dielectric fill material, and forming a patterned conductor layer including bit lines in electrical communication with the contacts.

22. A method for manufacturing a plurality of memory cells, comprising:
  providing a substrate including access circuitry for the plurality of memory cells, and having a contact surface with an array of conductive contact plugs connected to the access circuitry;
  adding a layer of bottom electrode material comprising a compound or alloy including a metal and nitrogen on the contact surface of the contact plugs of the substrate;
  forming a mask on the layer of bottom electrode material defining a pattern of spots, including lithographically defining a lithographic pattern including etch mask patches over the conductive contact plugs in the array of conductive contact plugs, and isotropically trimming the etch mask patches to produce a pattern of spots having sub-lithographic dimensions;
  removing material of the layer of bottom electrode material according to the pattern of spots to form a pattern of electrode pillars on corresponding conductive contact plugs in the array of conductive contact plugs, wherein the electrode pillars have respective bottom surfaces in electrical connection with corresponding conductive contact plugs in the array of conductive contact plugs;

forming a layer of dielectric diffusion barrier material comprising a compound including silicon and nitrogen covering the electrode pillars in the pattern of electrode pillars and the contact surface;

planarizing layer of dielectric diffusion barrier material and electrode pillars to provide a bottom electrode layer with an electrode surface exposing top surfaces of the electrode pillars in the pattern of electrode pillars, so that the respective top surfaces of the electrode pillars in the pattern of pillars have areas less than about 2000 nm$^2$ and are substantially uniform over the pattern of pillars;

during said planarizing, monitoring thickness of the dielectric layer, and stopping the planarizing upon detection of a predetermined thickness less than about 120 nm;

forming a layer of chalcogenide on the electrode surface having a thickness less than about 120 nm;

forming a layer of top electrode material over the layer of programmable resistive material; and forming pads comprising portions of the layer of phase change material and of the layer of top electrode material patterned at a same time as the layer of phase change material, for individual memory cells, applying a layer of dielectric fill material over the pads, forming via contacts through the layer of dielectric fill material, and forming a patterned conductor layer including bit lines in electrical communication with the via contacts.

23. The method of claim 22, wherein the layer of bottom electrode material includes a stack of materials, including a first material suitable for electrical contact with the programmable resistive material and a second material suitable for electrical contact with the array of contacts.

24. The method of claim 23, wherein the first material has resistivity higher than that of the second material.

25. The method of claim 22, wherein the layer of bottom electrode material includes a stack of materials, including a first material suitable for electrical contact with the programmable resistive material, and a second material having a lower resistivity than the first material.

26. The method of claim 22, wherein electrode pillars in the array of electrode pillars have respective bottom surfaces in contact with corresponding contacts in the array of contacts, and the bottom surfaces have larger areas than the top surfaces.

27. The method of claim 22, including after said planarizing, selectively removing a portion of the top of the electrode pillar to form a recess on top of the electrode pillar, and formation of the layer of phase change material includes filling the recess with phase change material.

* * * * *